(12) United States Patent
Mathews et al.

(10) Patent No.: US 10,559,346 B2
(45) Date of Patent: Feb. 11, 2020

(54) BIAS-CONTROLLED BIT-LINE SENSING SCHEME FOR EDRAM

(71) Applicant: International Business Machines Corporation, Armonk, NY (US)

(72) Inventors: Abraham Mathews, Austin, TX (US); Donald W Plass, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/875,052

(22) Filed: Jan. 19, 2018

(65) Prior Publication Data

US 2019/0228812 A1  Jul. 25, 2019

(51) Int. Cl.
  *G11C 11/4091* (2006.01)
  *G11C 11/408* (2006.01)
(52) U.S. Cl.
  CPC ...... *G11C 11/4091* (2013.01); *G11C 11/4085* (2013.01)
(58) Field of Classification Search
  CPC .................................................. G11C 11/4091
  See application file for complete search history.

(56) References Cited

U.S. PATENT DOCUMENTS

| 5,544,110 | A  | * | 8/1996  | Yuh ........................ G11C 7/065 |
|           |    |   |         | 327/55 |
| 6,198,329 | B1 |   | 3/2001  | Ezell et al. |
| 6,274,251 | B1 |   | 8/2001  | Ohashi et al. |
| 6,507,246 | B1 |   | 1/2003  | Brokaw |
| 7,327,190 | B2 |   | 2/2008  | D'Aramo et al. |
| 7,439,764 | B2 |   | 10/2008 | Twigg et al. |
| 7,675,342 | B2 |   | 3/2010  | Hsu et al. |
| 7,764,531 | B2 |   | 7/2010  | Aipperspach et al. |
| 9,378,815 | B2 |   | 6/2016  | Lee et al. |
| 9,721,658 | B1 |   | 8/2017  | Hollmer et al. |
| 2010/0157698 | A1 | * | 6/2010 | Barth, Jr. ............... G11C 7/065 |
|           |    |   |         | 365/189.15 |
| 2015/0117120 | A1 | * | 4/2015 | Barth, Jr. ............... G11C 7/067 |
|           |    |   |         | 365/189.02 |

OTHER PUBLICATIONS

IBM, "Programmable Resistor Voltage Divider That Saves Area in the Physical Construction Used in an Integrated Circuit", IP.com No. IPCOM000013405D, Jun. 18, 2003, 4 pages.

* cited by examiner

*Primary Examiner* — Tri M Hoang
(74) *Attorney, Agent, or Firm* — Cantor Colburn LLP; Margaret McNamara

(57) ABSTRACT

Embodiments include a method, memory system and a device for the operating a bit-line sensing circuit for bias-controlled bit-line sensing, the embodiments include an input for receiving a single-ended local bit-line signal, a pass device having a first terminal coupled to the input and a second terminal connected to a global bit-line node, The embodiments also include a first inverter having an input connected to the global bit-line node, a header circuit coupled to the first inverter and a first direct current (DC) bias circuit, and a footer circuit coupled to the first inverter and a second DC bias circuit. The embodiments include a second gated inverter having an input coupled to an output of the first inverter.

15 Claims, 5 Drawing Sheets

BIAS-CONTROLLED BIT-LINE SENSING SCHEME FOR EDRAM

BACKGROUND

The present invention generally relates to memory devices, and more specifically, to bias-controlled bit-line sensing schemes for eDRAM.

Sense amplifiers are used in memory devices to resolve the logic state of voltages present on local bit-lines in the memory system. There are different types of sense amplifiers that are available for various memory types, such as dynamic random-access memories (DRAMs) and static random-access memories (SRAMs). For example, sense amplifiers for single-ended bit-line sensing, such as in embedded dynamic random-access memory (eDRAM) designs can be sensed by an inverter. Other examples of sense amplifiers configurations include using differential bit-lines which can be sensed directly due to their symmetrical inputs provided to the sense amplifier.

SUMMARY

Embodiments of the present invention are directed to a method for bias-controlled bit-line sensing. A non-limiting example of the method includes configuring a header circuit and a footer circuit prior to sensing a state of a global bit-line node and receiving a single-ended local bit-line signal. The method also includes coupling the single-ended local bit-line signal to the global bit-line node with a pass device and sensing a state of the global bit-line node with a first inverter, wherein the header circuit and the footer circuit are coupled to the first inverter.

Embodiments of the present invention are directed to a circuit for bias-controlled bit-line sensing. A non-limiting example of the circuit includes an input for receiving a single-ended local bit-line signal, a pass device having a first terminal coupled to the input and a second terminal connected to a global bit-line node, and a first inverter having an input connected to the global bit-line node. Also, the circuit includes a header circuit coupled to the first inverter, a footer circuit coupled to the first inverter, and a second inverter having an input coupled to an output of the first inverter.

Embodiments of the invention are directed to a memory for bias-controlled bit-line sensing, the memory including an interface circuit for coupling the memory to a processor, a storage array having rows of storage elements selectively enabled by word-lines to assert stored values on corresponding column local bit-lines. The memory also includes bit-line sensing logic including sense amplifiers for generating corresponding global bit-line output signals, wherein the bit-line sensing logic includes a first inverter, a header circuit and a footer circuit.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
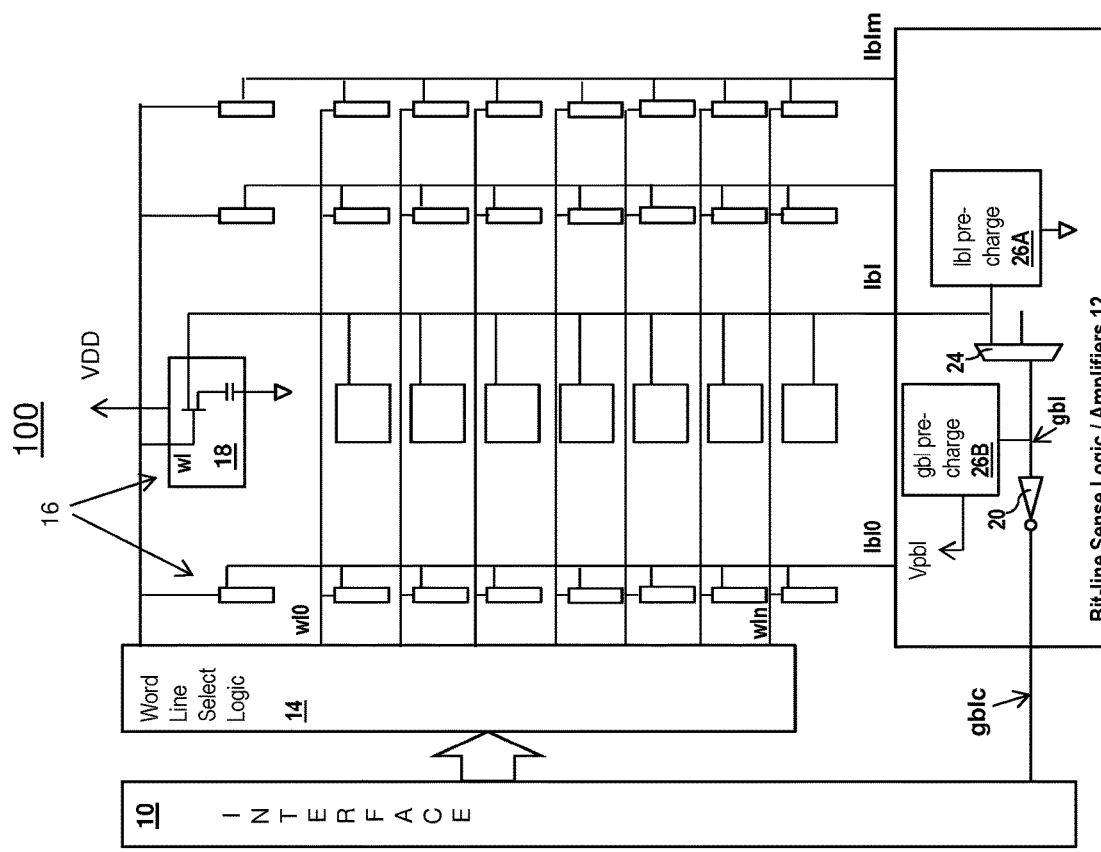
FIG. 1 depicts a block diagram illustrating a memory device.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, sense amplifiers are used in memory devices to resolve the logic state from the voltage being shared between a local bit-line and the global bit-line. A configuration of a sense amplifier for a single-ended bit-line is formed by a pair of cross-coupled inverters, where an input circuit buffers the local bit-line voltage.

The present invention relates to memory devices and other circuits in which sense amplifiers for sensing single-ended signals are desirable. Instead of the typical cross-coupled inverter circuit used in differential sensing, in the device disclosed herein, one of the inverters has an output control that interrupts the feedback from that inverter while sensing of a global bit-line node is performed, and then after the sensing is complete, the feedback is enabled to provide a latch that retains the value. The other inverter senses the bit-line input directly, so the local bit-lines can be multiplexed to the global bit-line node by individual pass devices. The local bit-lines are pre-charged to the power supply rail opposite the pre-charge power supply rail of the sense amplifier circuit. The intermediate voltage produced at the global bit-line node when evaluating a local bit-line that is in the pre-charge state is determined by the capacitance of the global bit-line node versus the local bit-line capacitance, so is not generally a mid-point voltage, but rather, a voltage close to the power supply rail opposite the pre-charge power supply rail of the sense amplifier circuit, so that the sense amplifier evaluates in response to the pre-charged state of the local bit-lines and does not evaluate if a selected storage cell overcomes the local bit-line pre-charge condition. A direct write feature can also be provided that sets the value of the global bit-line node for write-through operations.

Sense amplifiers are used in memory systems to detect signals provided by local bit-line outputs of storage arrays to generate a global bit-line output signal. The output is determined based on the charge sharing that occurs between the accessed cell, the local bit-line and the global bit-line node. The resulting charge is provided to an inverter to resolve the state of the memory cell being accessed.

The techniques described herein provide a sense amplifier that enables eDRAM designs with lower transfer ratios (cell capacitance versus bit-line) for higher cell density and manufacturability.

Sense amplifiers are utilized in memory devices to quickly resolve the logic state from the voltage present on the local bit-line. However, due to variations in manufacturing the circuit elements may operate using different operating parameters. For example, a transistor used in the sense amp can have a transistor's threshold voltage Vt may be somewhat higher or lower than the nominal values. Different chips can have significant offsets between n-type and p-type device threshold voltages. As these circuit elements are incorporated into a sense amplifier configuration the range for detecting a high state or low state of the bit-line can be skewed.

The bias signal applied to the header circuit and footer circuit can be configured to offset any of the unwanted effects of the devices from manufacturing. The transistors in the header circuit and the footer circuit function as a voltage controlled programmable transistors that can impact the voltage at which the sense amp resolves a high state and a low state of the memory cell.

By incorporating a header circuit and footer circuit to bias the sense amplifier, the sensitivity of the sense amplifier's detection can be optimized and increased for detecting the different states of the bit-line. For example, the nFETs (n-type field effect transistor) and pFETs (p-type field effect transistor) of the inverter can be properly balanced to determine the state of the memory cells. The techniques that are described herein provide a method and circuit to balance the sense amplifier offsets.

Turning now to an overview of the aspects of the invention, one or more embodiments of the invention address the above-described shortcomings of the prior art by providing a sense amplifier that incorporates series voltage controlled FETs which function as programmable resistors to configure the threshold voltage of the inverter. The bias-controlled sense amplifier compensates for pFET strength and nFET strength due to real-world variation of the manufactured devices which balances the logical threshold of the inverter. The point at which the inverter is balanced can be determined by one of many known techniques including but not limited to designed analysis, test measurements, and the like.

The above-described aspects of the invention address the shortcomings of the prior art by providing circuit elements to balance the sense amplifier's nFET and pFET strength for sensing the single-ended bit line voltage developed during the access of an eDRAM cell.

Turning now to a more detailed description of aspects of the present invention, FIG. 1 depicts a memory device 100 according to embodiments of the invention. FIG. 1 can represent an eDRAM memory internal to a processor integrated circuit, a separate memory device coupled to a processor by a bus, or a memory for integration in another circuit. The memory includes multiple memory cell columns 16 assembled from memory cells 18 coupled to local bit-lines. The power supply input for the memory is $+V_{DD}$ During a read operation, if the capacitor in the particular eDRAM memory cell that is enabled for the read operation for a row is charged (in the example representing a logical "1" value with respect to that memory cell), a corresponding local bit-line lbl is pulled high by the read operation. Otherwise, local bit-line lbl remains near ground potential. Local bit-lines lbl0-lblm are provided to the bit-line sense logic/sense amplifiers block 12, which also contain lbl pre-charge circuit 26A that, in the example memory array, pre-charges local bit-lines lbl0-lblm grounding local bit-lines lbl0-lblm in between read cycles. The bit-line pre-charge voltages may differ in other designs, which may include pre-charged, equalized designs, or designs in which the memory cell logical-0 state voltage is substantially lower than the bit-line pre-charge voltage. Local bit-lines lbl0-lblm are provided to the bit-line sense logic/sense amplifiers block 12 that selects the appropriate column bit-line according to multiplexers 24 and provides the value of the memory cell to external circuits in response to a memory read operation via a global bit-line output signal gblc provided to an interface 10. In one or more embodiments of the invention, the multiplexer 24 can receive two or more input signals from the local bit-lines lbl. In general, interface 10 will select from a number of global bit-lines, one for each sub-array within the memory. A row is selected by a particular word line enable signal wl0-wln asserted from a word line select logic 14. The present disclosure concerns particular sense amplifier designs that may be applied within sense logic/sense amplifiers block 12, according to the examples described below. A sense amplifier 20 for each global bit-line generates global bit-line output signal gblc. In one or more embodiments of the invention, the sense amplifier 20 is an inverter. A global bit-line input signal is provided as an input to sense amplifier 20 and is pre-charged by a gbl pre-charge circuit 26B to a logical-low voltage, ground in the example. In the example sense amplifiers described below, the pre-charged local bit-line lbl0-lblm that is selected is coupled directly to the global bit-line input signal, which in the sense amplifier embodiments described below is a global bit-line node gbl that evaluates when gbl pre-charge circuit 26B is disabled and the local bit-line coupled to sense amplifier 20, unless the selected one of local bit-lines lbl has been set to a non-pre-charged state by the value stored in the memory cell 18 selected for the read operation.

Figure 2:
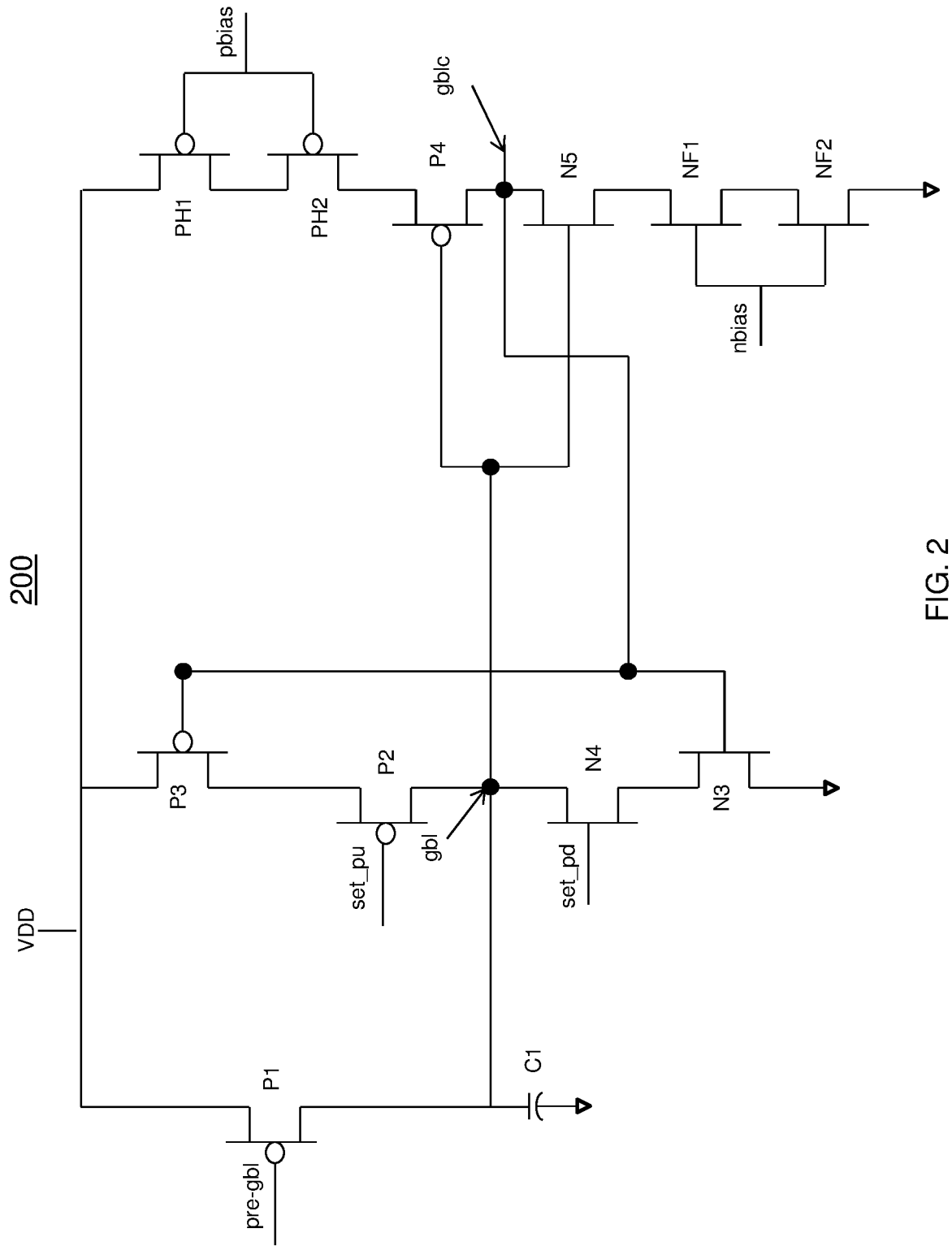
FIG. 2 depicts a schematic of a bias-controlled bit-line sensing circuit in accordance with one or more embodiments.

Now referring to FIG. 2, a circuit 200 for implementing bias-controlled bit-line sensing in accordance with one or more embodiments is shown. The sense amplifier circuit 200 is operated from the power supply voltage VDD. Prior to the read access of a memory cell (shown in FIG. 3), the global bit-line node gbl is pre-charged when transistor P1 receives control signal pre-gbl and is asserted (low voltage) to initialize the global bit-line node gbl to the logical high state. Based on the charge of the memory cell, the voltage of the global bit-line node gbl can change when a local bit-line is coupled to the global bit-line node gbl.

During a read operation, the transistor P1 is turned off. In addition, the transistors P2 and N4 are also turned off initially by respective control signals set_pu and set_pd.

As shown, the voltage of the global bit-line gbl node is coupled to the gates of the first inverter, which includes the transistors P4 and N5. The voltage state of the global bit-line node gbl will determine the output signal gblc of the first inverter, wherein gblc is a global bit-line complementary signal.

In one or more embodiments, a header circuit, including transistors PH1 and PH2, is coupled to the transistor P4 of the first inverter and an upper voltage rail. In embodiments, the transistors PH1 and PH2 are pFETs. The transistors PH1 and PH2 are enabled by the signal pbias during normal operation or read operation. Also, a footer circuit, including transistors NF1 and NF2, is coupled to the transistor N5 of the first inverter and ground/return voltage rail. In one or more embodiments, the transistors NF1 and NF2 are nFETS. The transistors NF1 and NF2 are enabled by the signal nbias during normal operation or a read operation. In one or more embodiments, the signal pbias and the signal nbias are received from a variable DC circuit during normal operation.

The transistors of the header circuit and footer circuit function as programmable resistors which can be configured to the needs of the customer. During normal operation or when a local bit-line (not shown) is accessed the header and footer circuits are enabled by the pbias and nbias signal to configure the voltage at which the high and low states of the global bit-line gbl node resolves to the logic-1 or logic-0 state. The gate voltage provided to both the header and footer circuits can be varied to change the resistance across the header and footer circuits and ultimately the voltage seen at the first inverter. These circuits can be tuned to optimize the voltage at which the sense amplifier 200 circuit will resolve the global bit-line node gbl to a high and low state.

The voltages applied to the header and footer circuits can be equal, or the voltage applied to the header circuit can be greater than the footer circuit or vice-versa. In addition, the transistors in the header circuit and the footer circuit can be selected based on the needs of the performance required. In one or more embodiments, the header circuit and footer circuit are always on but the strength of the voltage applied to the circuits can be varied. The transistors of these circuits function as voltage controlled nFETs and pFETs.

Transistors P3 and N3 form a second inverter that has an output enable circuit formed by transistors P2 and N4 which disable internal conduction paths of the second inverter so that the state of transistors P3 and N3 does not substantially effect the charge on global bit-line node gbl while the value of the local bit-line lbl is being evaluated. Once sufficient time has passed that the value of global bit-line node gbl is confidently established by charge-sharing between local bit-line lbl (shown in FIG. 3) and global bit-line node gbl, control signals set_pu and set_pd are asserted to turn on respective transistors P2 and N4, so that the output of the second inverter formed by transistors P3 and N3 is enabled, forming a latch that will hold the value of global bit-line node gbl indefinitely until the next read cycle, or until a control signal/rd (not shown) which can be coupled to the transistor P4 is de-asserted to indicate the end of the read cycle, in order to save power by eliminating leakage through transistors P5 and N5 by turning off a transistor P4. Other leakage paths are disabled when the pre-charge signal pre-gbl and control signals set_pu and set_pd are in their de-asserted states between read cycles. In one or more embodiments, the capacitor C1 can be used to maintain the global bit-line node gbl.

Figure 3:
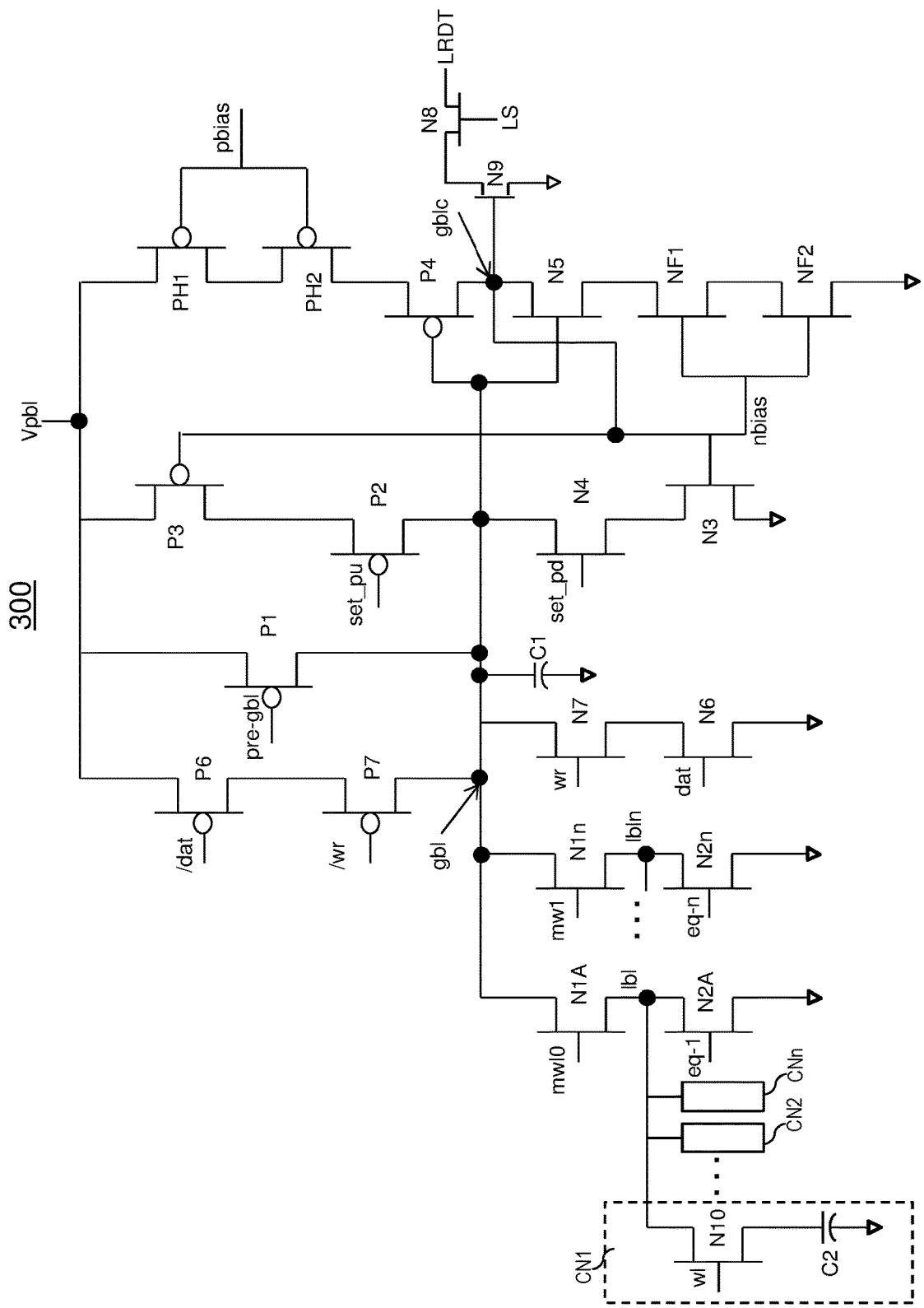
FIG. 3 depicts a schematic of a bias-controlled bit-line sensing circuit in accordance with one or more embodiments.

Now referring to FIG. 3, an implementation of the sense amplifier circuit of FIG. 2 in accordance with one or more embodiments is shown. The cell node CN1 includes capacitor C2 and pass-gate transistor N10 and is configured to receive the wordline signal wl. In one or more embodiments of the invention, the cell CN1 node is an eDRAM cell. In one or more embodiments of the invention, the local bit-line lbl can be coupled to a plurality of cell nodes such as CN2 . . . CNn as shown in FIG. 3.

The wordline wl for the corresponding row is used to generate a multiplexer control signal mwl0 that enables a transistor N1A during a read operation. Prior to the assertion of wordline wl, a local bit-line pre-charge control signal eq-1 is asserted, turning on a transistor N2A in order to set the voltage on bit-line lbl to ground, to pre-charge the local bit-line lbl. The memory cell being accessed will increase the voltage on local bit-line lbl when wordline signal wl is asserted if a logical high-voltage state is set in the cell. The voltage on local bit-line lbl will remain unchanged if the logical low-voltage state is set in the cell. Transistor N1A serves as a pass device that directly couples local bit-line lbl to a global bit-line node gbl. Global bit-line node gbl is pre-charged prior to the read operation to a polarity opposite the pre-charge state of local bit-line lbl by transistor P1, in response to a global bit-line pre-charge control signal pre-gbl. In one or more embodiments, a plurality of local bit-lines can be coupled to the global bit-line node gbl through a pass transistor that receives a signal mwl and is pre-charged through a transistor coupled to ground or a return rail voltage. As shown in FIG. 3, local bit-lines lbl-lbln are coupled to the global bit-line node gbl. The local bit-lines lbln being coupled to the global bit-line node gbl through transistors N1$n$ and N2$n$ which are configured to receive multiplex signals mw1l and pre-charge signals eq-n, respectively.

When the transistor N1 is turned on to start the local bit-line evaluation cycle, transistor P1 has been turned off, and also transistors P2 and N4 are also turned off by respective control signals set_pu and set_pd.

Transistors P4 and N5 form a first inverter that generates a global bit-line output signal gblc from the state of global bit-line node gbl. The header circuit and footer circuit are coupled to the first inverter to determine the voltage of the global bit-line node gbl that can switch the global bit-line output signal gblc.

The transistors can be programmed to offset the variability of the transistors from the manufacturing process or fine tune the transistors producing at the output of the sense amplifier 300.

The sense amplifier 300 also includes transistors P6 and N6 receive complementary write data values /dat and dat, respectively and transistors P7 and N7 receive complementary write strobe control signal /wr and wr. By activating write strobe control signals /wr and wr, the value represented by complementary write data values /dat and dat is written to global bit-line node gbl. In one or more embodiments of the invention, the transistors N6, N7, P6, and P7 are utilized to write data into the array. Also, transistors N8 and N9 provide a read path for the output signal lrdt of the data from the array. The output signal lrdt can reflect the complement of global bit-line gbl node. In one or more embodiments, the lrdt signal is a signal that is output of an interface such as interface 10 of FIG. 1, and the input to the transistor N8 is a logic select signal such as a select signal from word line select logic 14 of FIG. 1.

Figure 4:
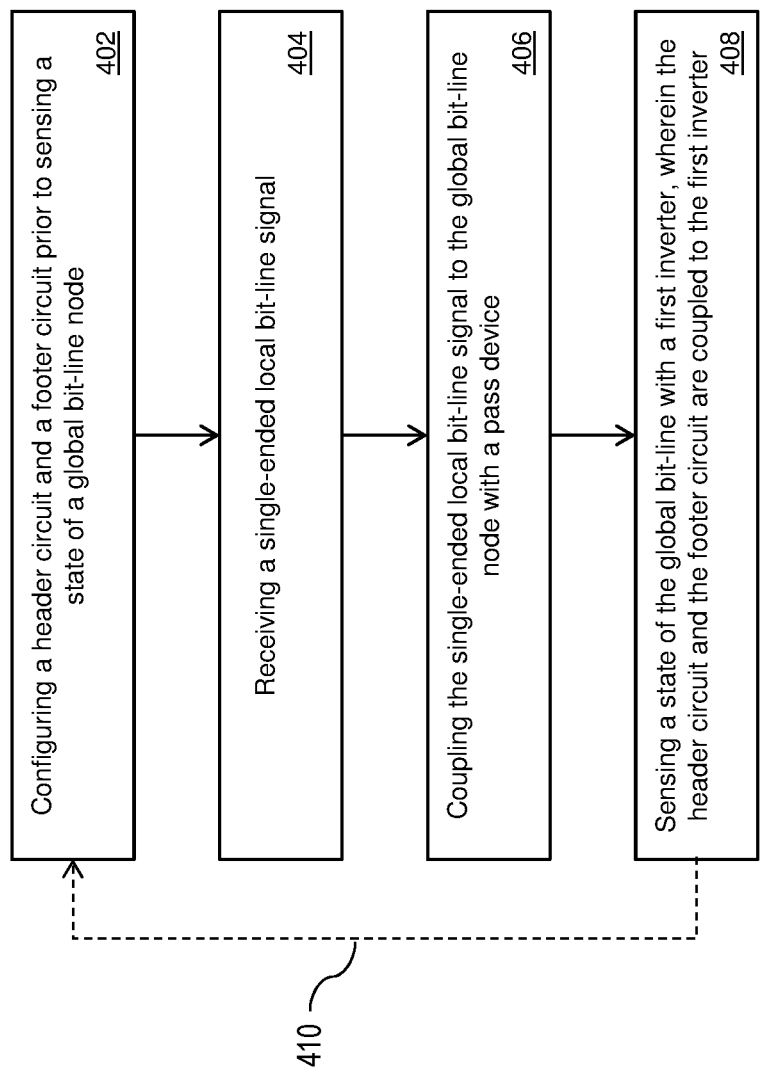
FIG. 4 depicts a flow chart for operating a bias-controlled bit-line sensing mechanism in accordance with one or more embodiments.

Now referring to FIG. 4, a method 400 for operating a bias-controlled bit-line sensing mechanism in accordance with one or more embodiments is shown. Block 402 provides configuring a header circuit and footer circuit prior to sensing a state of a global bit-line node. In one or more embodiments of the invention, the header and footer circuit are configured based on running tests to optimize the configuration of the sense-amplifier. Because the header circuit and the footer circuit are used, the input voltage that is used to resolve a logic-0 or a logic-1 can be manipulated to offset the skew due to the circuit elements. In one or more embodiments, the header and footer circuit function as programmable resistors to change the high/low output configuration of the first inverter.

Block 404 provides receiving a single ended local bit-line signal. Block 406 provides coupling a single-ended local bit-line signal to a global bit-line node with a pass device. Block 408 provides sensing a state of the global bit-line with a first inverter, wherein the header circuit and the footer circuit are coupled to a first inverter. In one or more embodiments, the first inverter senses the signal and resolves whether the voltage on the global bit-line node gbl is a logic-0 or a logic-1 state. In one or more embodiments of the invention, after sensing the state of the global bit-line, the header and footer circuits can be re-configured to optimize the points at which a logic-0 or logic-1 state is output.

Figure 5:
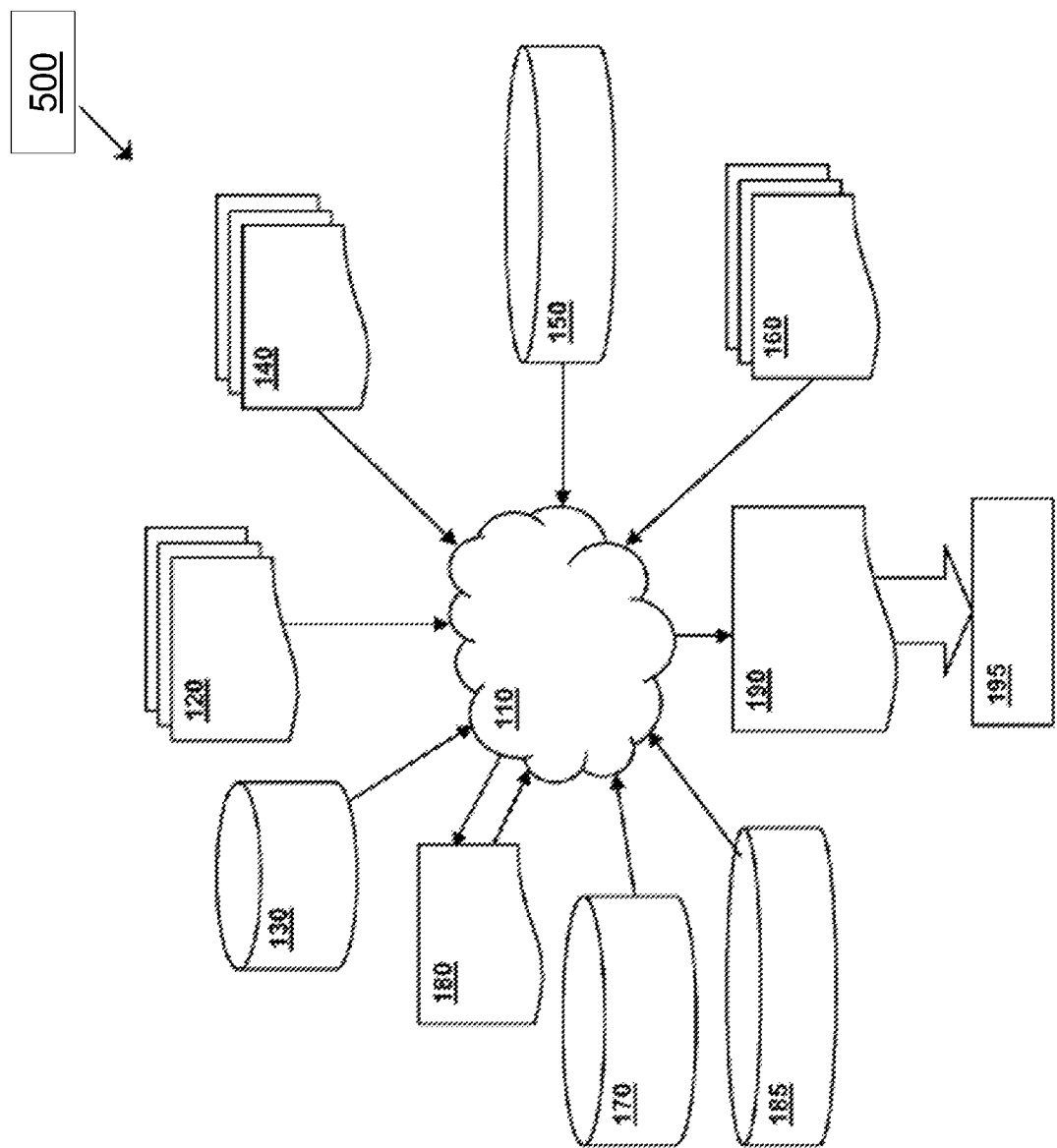
FIG. 5 depicts a flow diagram of a design process that can be used to fabricate, manufacture and test the memory device of FIG. 1.

FIG. 5 shows a block diagram of an exemplary design flow 500 used for example, in semiconductor IC logic design, simulation, test, layout, and manufacture. Design flow 500 includes processes, machines and/or mechanisms for processing design structures or devices to generate logically or otherwise functionally equivalent representations of the design structures and/or devices described above and shown in FIGS. 1-3. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA). FIG. 5 illustrates multiple such design structures including an input design structure 120 that is preferably processed by a design process 110. Input design structure 120 may be a logical simulation design structure generated and processed by design process 110 to produce a logically equivalent functional representation of a hardware device. Input design structure 120 may also or alternatively comprise data and/or program instructions that when processed by design process 110, generate a functional representation of the physical structure of a hardware device. Whether representing functional and/or structural design features, input design structure 120 may be generated using electronic computer-aided design (ECAD) such as implemented by a core developer/designer. When encoded on a machine-readable data transmission, gate array, or storage medium, input design structure 120 may be accessed and processed by one or more hardware and/or software modules within design process 110 to simulate or otherwise functionally represent an electronic component, circuit, electronic or logic module, apparatus, device, or system such as those shown in FIGS. 1-3. As such, input design structure 120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 110 preferably employs and incorporates hardware and/or software modules for synthesizing, translating, or otherwise processing a design/simulation functional equivalent of the components, circuits, devices, or logic structures shown in FIGS. 1-3 to generate a Netlist 180 which may contain design structures such as input design structure 120. Netlist 180 may comprise, for example, compiled or otherwise processed data structures representing a list of wires, discrete components, logic gates, control circuits, 110 devices, models, etc. that describes the connections to other elements and circuits in an integrated circuit design. Netlist 180 may be synthesized using an iterative process in which netlist 180 is resynthesized one or more times depending on design specifications and parameters for the device. As with other design structure types described herein, netlist 180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet or other networking suitable means.

Design process 110 may include hardware and software modules for processing a variety of input data structure types including Netlist 180. Such data structure types may reside, for example, within library elements 130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 140, characterization data 150, verification data 160, design rules 170, and test data files 185 which may include input test patterns, output test results, and other testing information. Design process 110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 110 without deviating from the scope and spirit of the invention. Design process 110 may also include modules for performing standard circuit design processes such as timing analysis, verification, design rule checking, place and route operations, etc. Design process 110 employs and incorporates logic and physical design tools such as HDL compilers and simulation model build tools to process input design structure 120 together with some or all of the depicted supporting data structures along with any additional mechanical design or data (if applicable), to generate a second design structure 190. Design structure 190 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to input design structure 120, design structure 190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3. In one embodiment, design structure 190 may comprise a compiled, executable HDL simulation model that functionally simulates the devices shown in FIGS. 1-3.

Design structure 190 may also employ a data format used for the exchange of layout data of integrated circuits and/or symbolic data format (e.g. information stored in a GDSII (GDS2), GL1, OASIS, map files, or any other suitable format for storing such design data structures). Design structure 190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3 and 5. Design structure 190 may then proceed to a stage 195 where, for example, design structure 190: proceeds to tape-out, is released to manufacturing, is released to a mask house, is sent to another design house, is sent back to the customer, etc.

While the invention has been particularly shown and described with reference to the preferred embodiments thereof, it will be understood by those skilled in the art that the foregoing and other changes in form, and details may be made therein without departing from the spirit and scope of the invention.

One or more embodiments of the invention improve over the prior art by accommodating a wider range of nFET and pFET device tolerances. These intolerances can result from manufacturing defects or systematic device offsets. The sensitivity to resolving different states of a memory cell/device optimizes the functionality of the sense amplifiers over the prior art. In addition, the improved sensitivity makes it possible to sense smaller signals, and as such more cells per bit-line or smaller cell storage capacitor can be implemented in the configuration.

The introduction of programmable resistors in series with the sensing inverter, in the form of additional pFETs and nFETs whose gates are connected to variable DC bias circuits. By modulating these bias voltages, the sense amp can be made to favor 1's or 0's to compensate for systematic offsets.

What is claimed is:
1. A bit-line sensing circuit for bias-controlled bit-line sensing, the circuit comprising:
    an input for receiving a single-ended local bit-line signal;
    a pass device having a first terminal coupled to the input and a second terminal connected to a global bit-line node;
    a first inverter having an input connected to the global bit-line node;
    a header circuit coupled to the first inverter, wherein the header circuit includes two or more p-type transistors that are in series and are coupled to a high voltage rail and the first inverter, wherein the two or more p-type transistors receive a common bias signal;
    a footer circuit coupled to the first inverter, wherein the footer circuit includes two or more n-type transistors that are in series and are coupled to a low voltage rail and the first inverter, wherein the two or more n-type transistors receive a common bias signal; and
    a second inverter having an input coupled to an output of the first inverter.

2. The circuit of claim 1, wherein the header circuit receives a p-bias signal and the footer circuit receives an n-bias signal, wherein the p-bias signal and the n-bias signal are different.

3. The circuit of claim 1, wherein gates of one or more transistors of the footer circuit and gates of one or more transistors of the header circuit are coupled to one or more variable direct current (DC) bias circuits.

4. The circuit of claim 2, wherein the p-bias signal and the n-bias signal are configured to be weighted to at least one of a high state or low state.

5. A memory, comprising:
- an interface circuit for coupling the memory to a processor;
- a storage array having rows of storage elements selectively enabled by word-lines to assert stored values on corresponding column local bit-lines; and
- bit-line sensing logic including sense amplifiers for generating corresponding global bit-line output signals, wherein the bit-line sensing logic includes a first inverter, a header circuit and a footer circuit, wherein the header circuit includes two or more p-type transistors that are in series and are coupled to a high voltage rail and the first inverter, wherein the two or more p-type transistors receive a common bias signal, and wherein the footer circuit includes two or more n-type transistors that are in series and that are coupled to a low voltage rail and the first inverter, wherein the two or more n-type transistors receive a common bias signal.

6. The memory of claim 5, wherein the header circuit receives a p-bias signal and the footer circuit receives an n-bias signal, wherein the p-bias signal and the n-bias signal are different.

7. The memory of claim 5, wherein gates of one or more transistors of the footer circuit and gates of one or more transistors of the header circuit are coupled to one or more variable DC bias circuits.

8. The memory of claim 6, wherein the p-bias signal and the n-bias signal are configured to be weighted to at least one of a high state or low state.

9. A method of operation of a dynamic bit-line sensing circuit for providing a global bit-line output of a storage array, the method comprising:
- configuring a header circuit and a footer circuit prior to sensing a state of a global bit-line node;
- receiving a single-ended local bit-line signal;
- coupling the single-ended local bit-line signal to the global bit-line node with a pass device; and
- sensing a state of the global bit-line node with a first inverter, wherein the header circuit and the footer circuit are coupled to the first inverter, wherein the header circuit includes two or more p-type transistors that are in series and that are coupled to a high voltage rail and the first inverter, wherein the two or more p-type transistors receive a common bias signal, and wherein the footer circuit includes two or more n-type transistors that are in series and that are coupled to a low voltage rail and the first inverter, wherein the two or more n-type transistors receive a common bias signal.

10. The method of claim 9, further comprising: selectively holding a state of the global bit-line output in response to a second state of at least one control signal by coupling a second inverter between the global bit-line output and the global bit-line node; and
- preventing the second inverter from substantially affecting the state of the global bit-line node prior to completion of the sensing by de-coupling the second inverter from the global bit-line node in response to a first state of the at least one control signal.

11. The method of claim 9, wherein the header circuit receives a p-bias signal and the footer circuit receives an n-bias signal, wherein the p-bias signal and the n-bias signal are different.

12. The method of claim 9, wherein gates of one or more transistors of the footer circuit and gates of one or more transistors of the header circuit are coupled to one or more variable DC bias circuits.

13. The method of claim 11, wherein the p-bias signal and the n-bias signal are configured to be weighted to at least one of a high state or low state.

14. The method of claim 10, wherein the preventing is performed by disabling at least one output conduction path of the second inverter responsive to the at least one control signal, wherein when the at least one control signal is in the second state, a state of the global bit-line node assumes a state of the output of the second inverter, and wherein when the at least one control signal is in the first state the at least one output conduction path is disabled, preventing the output of the second inverter from controlling the state of the global bit-line node.

15. The method of claim 10, wherein the pass device is a first pass device, wherein the single-ended local bit-line signal is a first local bit-line signal, and wherein the method further comprises:
- coupling at least one additional single-ended local bit-line signal to the global bit-line node with at least one additional pass device;
- selecting from among the first local bit-line signal and the at least one additional single-ended local bit-line signal by selectively enabling one of the first pass device or the at least one additional pass device.

* * * * *